(12) United States Patent
Marte et al.

(10) Patent No.: US 9,287,485 B2
(45) Date of Patent: Mar. 15, 2016

(54) METHODS FOR MAKING LOW RESISTIVITY JOINTS

(75) Inventors: Judson Sloan Marte, Wynantskill, NY (US); Xianrui Huang, Clifton Park, NY (US); Evangelos Trifon Laskaris, Schenectady, NY (US); Bruce Alan Knudsen, Amsterdam, NY (US); Thomas Robert Raber, Schenectady, NY (US); Robert John Zabala, Schenectady, NY (US); James William Bray, Niskayuna, NY (US); Paul Shadforth Thompson, Stephentown, NY (US); Sergio Paulo Martins Loureiro, Saratoga Springs, NY (US); Curtis Alan Johnson, Niskayuna, NY (US); Sylvia Marie Decarr, Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 1036 days.

(21) Appl. No.: 13/415,949

(22) Filed: Mar. 9, 2012

(65) Prior Publication Data

US 2012/0165200 A1    Jun. 28, 2012

Related U.S. Application Data

(62) Division of application No. 11/731,536, filed on Mar. 30, 2007, now abandoned.

(51) Int. Cl.
*H01L 39/24* (2006.01)
*H01L 39/02* (2006.01)

(Continued)

(52) U.S. Cl.
CPC *H01L 39/02* (2013.01); *H01R 4/68* (2013.01); *H01R 13/03* (2013.01); *Y10T 29/49014* (2015.01); *Y10T 29/49194* (2015.01)

(58) Field of Classification Search
USPC ............ 29/605, 606, 856, 858, 868, DIG. 47; 174/15.4, 15.5, 125.1; 264/250, 254, 264/259, 271.1, 294, 295, 275
See application file for complete search history.

(56) References Cited

U.S. PATENT DOCUMENTS

| 5,082,164 A | 1/1992 | Rumaner et al. | |
| 5,689,875 A * | 11/1997 | Kanithi | 29/599 |
| 5,798,312 A * | 8/1998 | Okada et al. | 505/230 |

(Continued)

FOREIGN PATENT DOCUMENTS

| JP | 2002353528 A | 12/2002 |
| JP | 2003022719 A | 1/2003 |

(Continued)

OTHER PUBLICATIONS

W. Mickelson et al.; "Effects of carbon doping on superconductivity in magnesium diboride"; Phys. Rev. B; The American Physical Society (2002) vol. 65, 052505 (3 Pages).

(Continued)

*Primary Examiner* — Paul D Kim
(74) *Attorney, Agent, or Firm* — Seema S. Katragadda

(57) ABSTRACT

Method for joining wires using low resistivity joints is provided. More specifically, methods of joining one or more wires having superconductive filaments, such as magnesium diboride filaments, are provided. The wires are joined by a low resistivity joint to form wires of a desired length for applications, such in medical imaging applications.

8 Claims, 12 Drawing Sheets

(51) Int. Cl.
*H01R 4/68* (2006.01)
*H01R 13/03* (2006.01)

(56) References Cited

U.S. PATENT DOCUMENTS

| | | | |
|---|---|---|---|
| 6,921,865 B2 | 7/2005 | Morita et al. | |
| 7,226,894 B2 | 6/2007 | Raber et al. | |
| 7,294,606 B2 | 11/2007 | Suplinskas et al. | |
| 7,494,688 B2 | 2/2009 | Venkataramani et al. | |
| 2004/0077224 A1* | 4/2004 | Marchese | 439/696 |
| 2004/0121915 A1 | 6/2004 | Tanaka et al. | |
| 2005/0245400 A1 | 11/2005 | Dou et al. | |

FOREIGN PATENT DOCUMENTS

| | | | |
|---|---|---|---|
| JP | 2004192934 A | 7/2004 | |
| JP | 2005129529 A | 5/2005 | |

OTHER PUBLICATIONS

A. V. Pogrebnyakov et al.; "Carbon-Doped MgB2 Thin Films Grown by Hybrid Physical-Chemical Vapor Deposition"; IEEE Transactions on Applied Superconductivity, Jun. 2005, pp. 3321-3324; vol. 15, No. 2.

G.Grasso; "Development of MgB2 conductors for DC and AC applications"; CNR-INFM & Columbus Superconductors Sri Genova, Italy (27 Pages).

Unofficial English translation of Office Action from JP dated Jul. 31, 2012, 2 Pages.

* cited by examiner

METHODS FOR MAKING LOW RESISTIVITY JOINTS

CROSS-REFERENCE TO RELATED APPLICATIONS

This application is a divisional of U.S. patent application Ser. No. 11/731,536, which was filed on Mar. 30, 2007, now abandoned, which is herein incorporated by reference.

BACKGROUND

The invention relates generally to methods of the formation of persistent joints in superconducting wires, and more specifically, to the formation of persistent joints in magnesium diboride wires.

Typically, magnesium diboride is employed as a superconductor in applications such as magnetic resonance imaging (MRI), generators, motors and fault current limiters. Advantageously, magnesium diboride powders display very strongly linked current flows having large critical current densities ($J_c$) on the order of $10^7$ A/cm$^2$ in thin films. Additionally, magnesium diboride powders in the shape of wires, tapes or ribbons display $J_c$ values on the order of $10^5$ A/cm$^2$. Further, the upper critical fields ($H_c$) and irreversibility fields ($H_{irr}$) of these powders are greater than about 30 Tesla in thin films.

Typically, magnesium diboride powders are formed by the reaction of elemental magnesium and boron. The result of this process is the production of a fine powder that exhibits high current carrying capabilities at high magnetic fields, properties that are desirable in applications, such as MRI, where large powerful magnets are required. However, the existing methods of making these powders prevent magnesium diboride from achieving the very high operating fields and critical current values, particularly, when processed into wires. This has prevented employing this technology for applications such as MRI. In consequence, these powders should be customized to enable such applications. For example, for MRI applications, it is desirable to have magnesium diboride powders, which may be drawn into thin wires without breaking while employing conventional drawing methods. In some cases, these properties may be achieved by a combination of doping and the addition of other additive materials in the composition of the magnesium diboride powders during processing of the powder. However, this doping and addition process should be carried out in such a way that prevents coating of the particles of the magnesium diboride by non-superconducting impurities. Also, it is desirable to have a uniform dispersion of the additive materials throughout the magnesium diboride powder.

Further, superconductive wires are generally fabricated as units having lengths that are much shorter than the lengths necessary in many applications, such as MRI. Accordingly, superconductive wires may be joined together, end-to-end, to provide a superconductor having sufficient length for a given application. To prevent resistive losses through the length of the wire, the joints connecting two wires should be "persistent." That is, there should be very low resistance, ideally zero, through the joints. The formation of such persistent joints provides a number of design challenges. The challenges are further amplified with the introduction of magnesium diboride wires.

Accordingly, there is a need for a method of coupling magnesium diboride wires to form wires of sufficient length for applications, such as MRI, where there is minimal resistance at the connection joints.

BRIEF DESCRIPTION

In accordance with one aspect of the present technique, there is provided a method of joining wires. The method comprises introducing a magnesium diboride joint material to an end of a first wire and an end of a second wire at a joint area, wherein at least one of the first and second wires comprises superconductive magnesium diboride filaments. The method further comprises affecting the joint area such that the end of the first wire and the end of the second wire are electrically and mechanically coupled through the joint material.

In accordance with another aspect of the present technique, there is provided a method of joining superconductive wires. The method comprises preparing an end of a first wire in a mateable configuration, wherein the first wire comprises superconductive magnesium diboride filaments surrounded by a conductive cladding. The method further comprises preparing an end of a second wire in a mateable configuration, wherein the second wire comprises superconductive magnesium diboride filaments surrounded by a conductive cladding. The method further comprises mateably joining the end of the first wire to the end of the second wire. The method further comprises surrounding the mateably joined end of the first wire and the end of the second wire in a wrapping material.

In accordance with another aspect of the present technique, there is provided a superconductive wire. The superconductive wire comprises a first wire segment having superconductive filaments comprising magnesium diboride. The wire further comprises a second wire segment having superconductive filaments comprising magnesium diboride. The wire further comprises a low resistivity joint coupling the first wire segment to the second wire segment, wherein the persistent joint comprises magnesium diboride.

These and other features, aspects, and advantages of the invention will become better understood when the following detailed description is read with reference to the accompanying drawings in which like characters represent like parts throughout the drawings.

DRAWINGS

DETAILED DESCRIPTION

Figure 1:
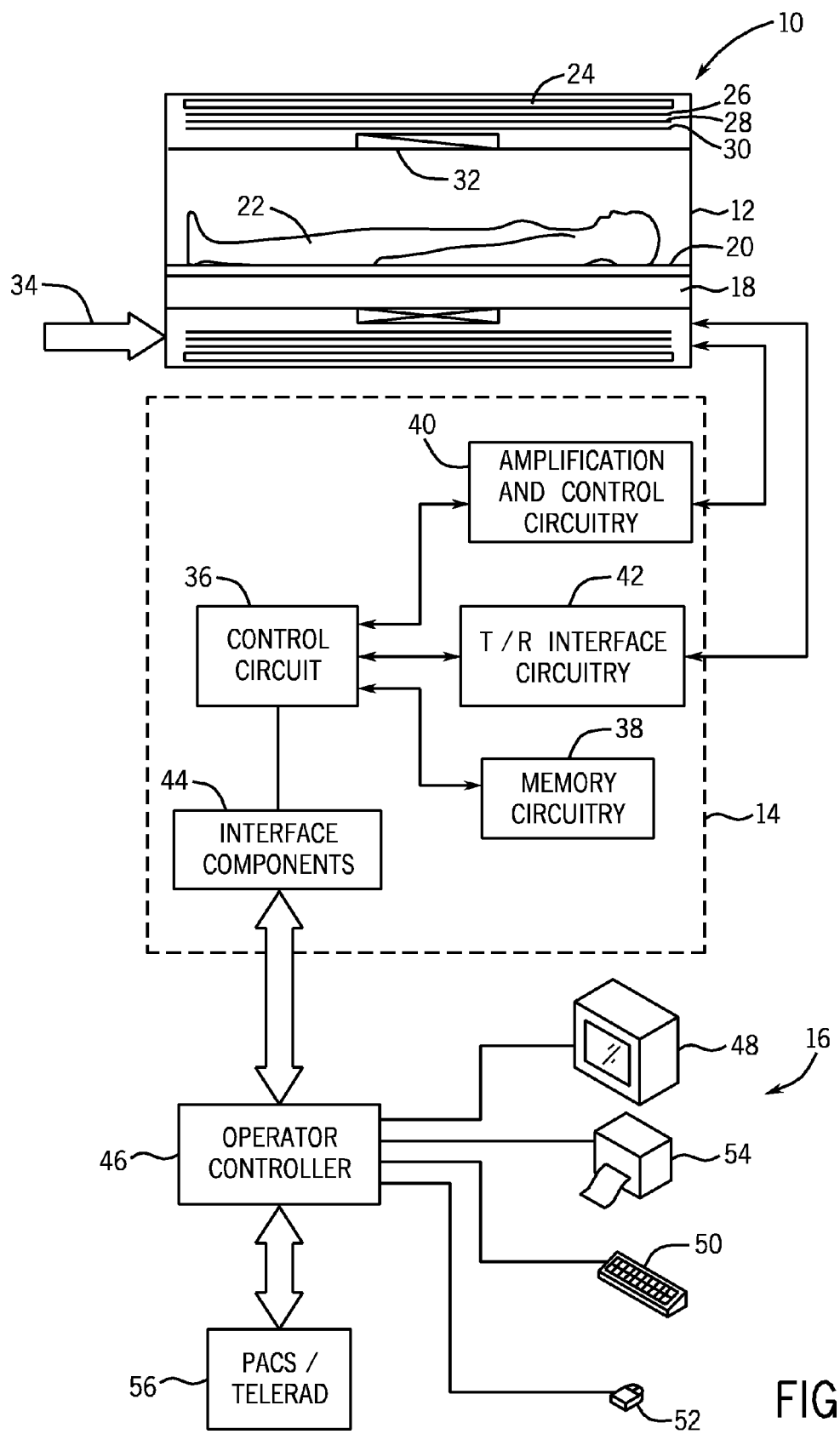
FIG. 1 is a diagrammatical representation of an MRI system for use in medical diagnostic imaging, according to certain embodiments of the present technique.

Referring now to FIG. 1, a magnetic resonance imaging (MRI) system 10 is illustrated diagrammatically as including a scanner 12, scanner control circuitry 14, and system control circuitry 16. While MRI system 10 may include any suitable MRI scanner or detector, in the illustrated embodiment the system includes a full body scanner comprising a patient bore 18 into which a table 20 may be positioned to place a patient 22 in a desirable position for scanning. Scanner 12 may be of any suitable type of rating, including scanners varying from 0.5 Tesla ratings to 1.5 Tesla ratings and beyond.

Scanner 12 includes a series of associated coils for producing controlled magnetic fields, for generating radiofrequency excitation pulses, and for detecting emissions from gyromagnetic material within the patient in response to such pulses. In the diagrammatical view of FIG. 1, a primary magnet coil 24 is provided for generating a primary magnetic field generally aligned with patient bore 18. A series of gradient coils 26, 28 and 30 are grouped in a coil assembly for generating controlled magnetic gradient fields during examination sequences as described more fully below. A radiofrequency coil (RF) 32 is provided for generating RF pulses for exciting the gyromagnetic material. In the embodiment illustrated in FIG. 1, coil 32 also serves as a receiving coil. Thus, RF coil 32 may be coupled with driving and receiving circuitry in passive and active modes for receiving emissions from the gyromagnetic material and for applying radiofrequency excitation pulses, respectively. Alternatively, various configurations of receiving coils may be provided separate from RF coil 32. Such coils may include structures specifically adapted for target anatomies, such as head coil assemblies, and so forth. Moreover, receiving coils may be provided in any suitable physical configuration, including phased array coils, and so forth.

In the presently contemplated configuration, the gradient coils 26, 28 and 30 have different physical configurations adapted to their function in the imaging system 10. As will be appreciated by those skilled in the art, the coils are comprised of superconductive elements, such as wires, cables, bars or plates which are wound or cut to form a coil structure which generates a gradient field upon application of control pulses as described below. In particular, the coils may comprise superconducting magnesium diboride wires. In certain embodiments, the superconducting elements include doped magnesium diboride powders having a first phase and a second phase. In certain embodiments, the first phase may include a plurality of magnesium diboride particles, which are surrounded by the second phase. As will be described in detail below, the second phase may include particles or films of carbide, boride, nitride, oxide, oxy-carbide, oxy-boride, oxy-nitride, or combinations thereof. The placement of the coils within the gradient coil assembly may be done in several different orders, but in the present embodiment, a Z-axis coil is positioned at an innermost location, and is formed generally as a solenoid-like structure which has relatively little impact on the RF magnetic field. Thus, in the illustrated embodiment, gradient coil 30 is the Z-axis solenoid coil, while coils 26 and 28 are Y-axis and X-axis coils respectively.

The coils of scanner 12 are controlled by external circuitry to generate desired fields and pulses, and to read signals from the gyromagnetic material in a controlled manner. As will be appreciated by those skilled in the art, when the material, typically bound in tissues of the patient, is subjected to the primary field, individual magnetic moments of the paramagnetic nuclei in the tissue partially align with the field. While a net magnetic moment is produced in the direction of the polarizing field, the randomly oriented components of the moment in a perpendicular plane generally cancel one another.

Gradient coils 26, 28 and 30 serve to generate precisely controlled magnetic fields, the strength of which vary over a predefined field of view, typically with positive and negative polarity. When each coil is energized with known electric current, the resulting magnetic field gradient is superimposed over the primary field and produces a desirably linear variation in the Z-axis component of the magnetic field strength across the field of view. The field varies linearly in one direction, but is homogenous in the other two.

The coils of scanner 12 are controlled by scanner control circuitry 14 to generate the desired magnetic field and radiofrequency pulses. In the diagrammatical view of FIG. 1, control circuitry 14 includes a control circuit 36 for commanding the pulse sequences employed during the examinations, and for processing received signals. Control circuit 36 may include any suitable programmable logic device, such as a CPU or digital signal processor of a general purpose or application-specific computer. Control circuit 36 further includes memory circuitry 38, such as volatile and non-volatile memory devices for storing physical and logical axis configuration parameters, examination pulse sequence descriptions, acquired image data, programming routines, and so forth, used during the examination sequences implemented by the scanner.

Interface between the control circuit 36 and the coils of scanner 12 is managed by amplification and control circuitry 40 and by transmission and receive interface circuitry 42. Circuitry 40 includes amplifiers for each gradient field coil to supply drive current to the field coils in response to control signals from control circuit 36. Interface circuitry 42 includes additional amplification circuitry for driving RF coil 32. Moreover, where the RF coil serves both to emit the radiofrequency excitation pulses and to receive MR signals, circuitry 42 will typically include a switching device for toggling the RF coil between active or transmitting mode, and passive or receiving mode. A power supply, denoted generally by reference numeral 34 in FIG. 1, is provided for energizing the primary magnet 24. Finally, circuitry 14 includes interface components 44 for exchanging configuration and image data with system control circuitry 16. It should be noted that, while in the present description reference is made to a horizontal cylindrical bore imaging system employing a superconducting primary field magnet assembly, the present technique may be applied to various other configurations, such as scanners employing vertical fields generated by superconducting magnets, permanent magnets, electromagnets or combinations of these means.

System control circuitry 16 may include a wide range of devices for facilitating interface between an operator or radiologist and scanner 12 via scanner control circuitry 14. In the illustrated embodiment, for example, an operator controller 46 is provided in the form of a computer work station employing a general purpose or application-specific computer. The station also typically includes memory circuitry for storing examination pulse sequence descriptions, examination protocols, user and patient data, image data, both raw and processed, and so forth. The station may further include various interface and peripheral drivers for receiving and exchanging data with local and remote devices. In the illustrated embodiment, such devices include a conventional computer keyboard 50 and an alternative input device such as a mouse 52.

A printer 54 is provided for generating hard copy output of documents and images reconstructed from the acquired data. A computer monitor 48 is provided for facilitating operator interface. In addition, system 10 may include various local and remote image access and examination control devices, represented generally by reference numeral 56 in FIG. 1. Such devices may include picture archiving and communication systems (PACS), teleradiology systems, and the like.

Figure 3:
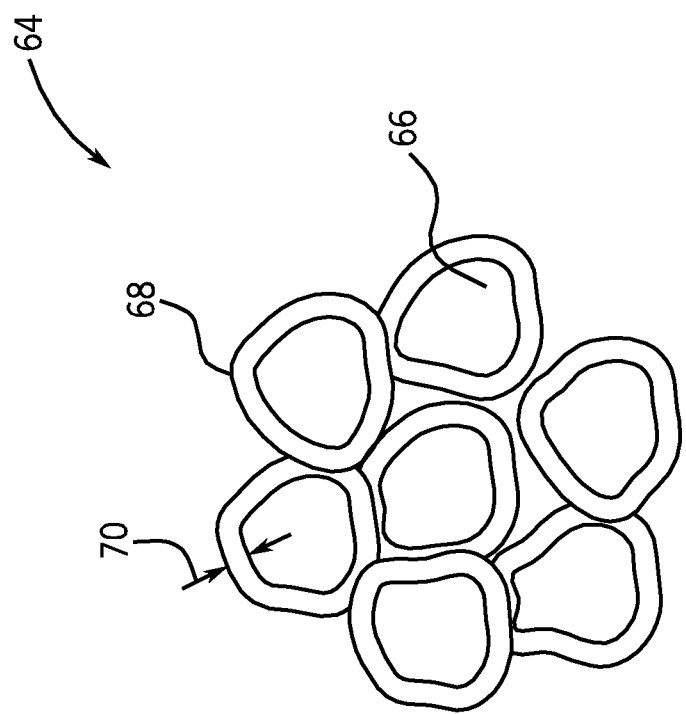
FIGS. 2-3 are cross sectional views of magnesium diboride powder having silicon carbide particles disposed on the plurality of particles.
Figure 2:
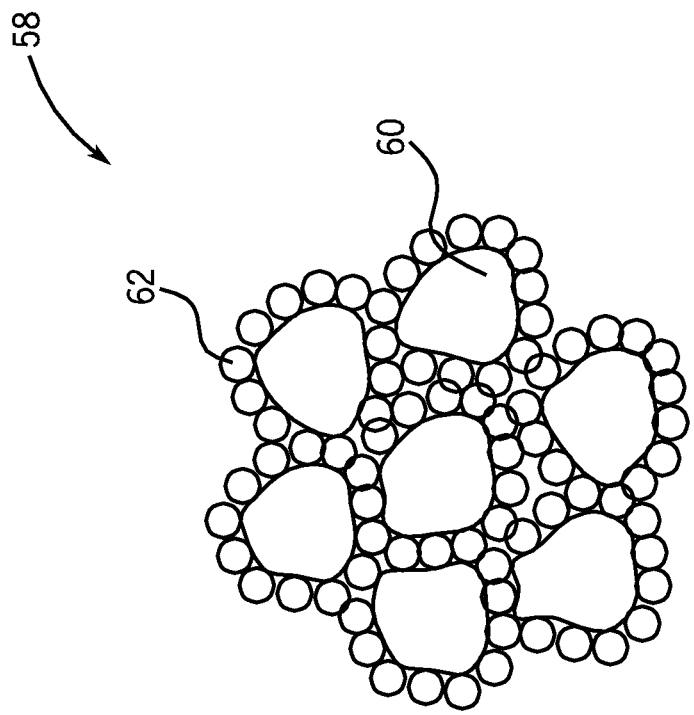

Turning now to FIGS. 2 and 3, doped magnesium diboride powders having a first phase and a second phase are illustrated. In the illustrated embodiment, the doped magnesium diboride powders include a first phase, which includes a plurality of magnesium diboride particles that are surrounded by second phase coating such as particles or films. In certain embodiments, the second phase may include carbide, boride, nitride, oxide, oxy-carbide, oxy-boride, oxy-nitride, or combinations thereof. In an exemplary embodiment, the second phase may include silicon carbide. In another embodiment, the second phase may include silicon oxy-carbide.

In certain embodiments, the doped magnesium diboride powders may include the plurality of magnesium diboride particles that may be represented by a chemical formula $MgB_{2-x}S_x$, where S represents the dopant, and B represents the chemical element boron. In certain embodiments, S may include one or more of carbon, boron, oxygen, nitrogen or combinations thereof. In one embodiment, S includes carbon, i.e., the magnesium diboride powder is carbon doped. In other embodiments, S includes boron, nitrogen or oxygen. In these embodiments, the magnesium diboride powder is boron doped, nitrogen doped or oxygen doped. Further, x represents an atomic percentage of the dopant S that substitutes boron in the magnesium diboride lattice. In some embodiments, the value of x may vary in a range of about 5 percent to about 15 percent, from about 6 percent to about 12 percent, and preferably in a range of about 8 percent to about 10 percent. Preferably, the doping S in the magnesium diboride lattice may be homogeneous. The doping of S into the lattice of magnesium diboride may result in higher upper critical field ($H_c$). Additionally, dispersing the second phase, such as silicon carbide particles throughout the microstructure of magnesium diboride may enhance the critical current density ($J_c$). As will be appreciated, high values of both $H_c$ and $J_c$ are required for MRI applications.

As illustrated in FIG. 2, in certain embodiments of the doped magnesium diboride powders 58, the first phase having the magnesium diboride particles 60 may be surrounded by relatively smaller second phase particles 62 such as silicon carbide particles. In these embodiments, the size of the magnesium diboride particles 60 may vary in a range of about 20 nanometers to about 500 micrometers, and the size of the second phase particles 62 may be in a range of about 5 nanometers to about 50 nanometers. Accordingly, due to relatively smaller particle size of the magnesium diboride powder 58, it may be possible to form wires from these powders which have a higher fraction of superconducting material, that is, which have a higher fraction of magnesium diboride as compared to other conventional cables of magnesium diboride powders. These wires in turn may be used to form cables.

As will be appreciated, a higher amount of superconducting material enables high current density ($I_c$), critical current density ($J_c$) and upper critical field ($H_c$). In an exemplary embodiment, $I_c$ at self-field and 4K may be in a range of about 80 A to about 1000 A. In another embodiment, $J_c$ may be in a range of about $10^5$ A/cm$^2$ to about $10^7$ A/cm$^2$. In one embodiment, $H_c$ may be in a range of about 10 Tesla to about 100 Tesla.

FIG. 3 illustrates an alternate embodiment of the doped magnesium diboride powder 58 of FIG. 2. In the illustrated embodiment, the magnesium diboride powder 64 includes first phase having magnesium diboride particles 66 surrounded by a thin film 68 of the second phase such as silicon carbide. In this embodiment, the magnesium diboride particles 66 and the silicon carbide thin film 68 may form a core-shell structure with magnesium diboride particles 66 forming the core and the silicon carbide thin film 68 forming the shell. In certain embodiments, the thickness 70 of the thin film 68 may be on the order of a few nanometers. In an exemplary embodiment, the thickness 70 of the thin film 68 may be less than about 9 nanometers to prevent loss of percolation current density due to the non-conducting nature of silicon carbide.

Figure 4:
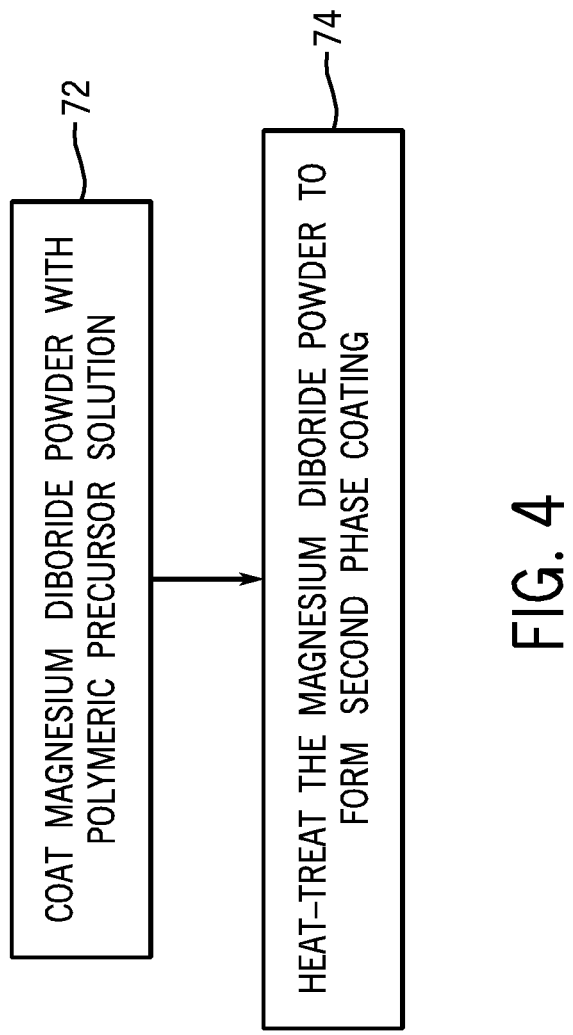
FIGS. 4-5 are flow charts illustrating exemplary methods of manufacturing magnesium diboride powders, according to certain embodiments of the present technique.
Figure 5:
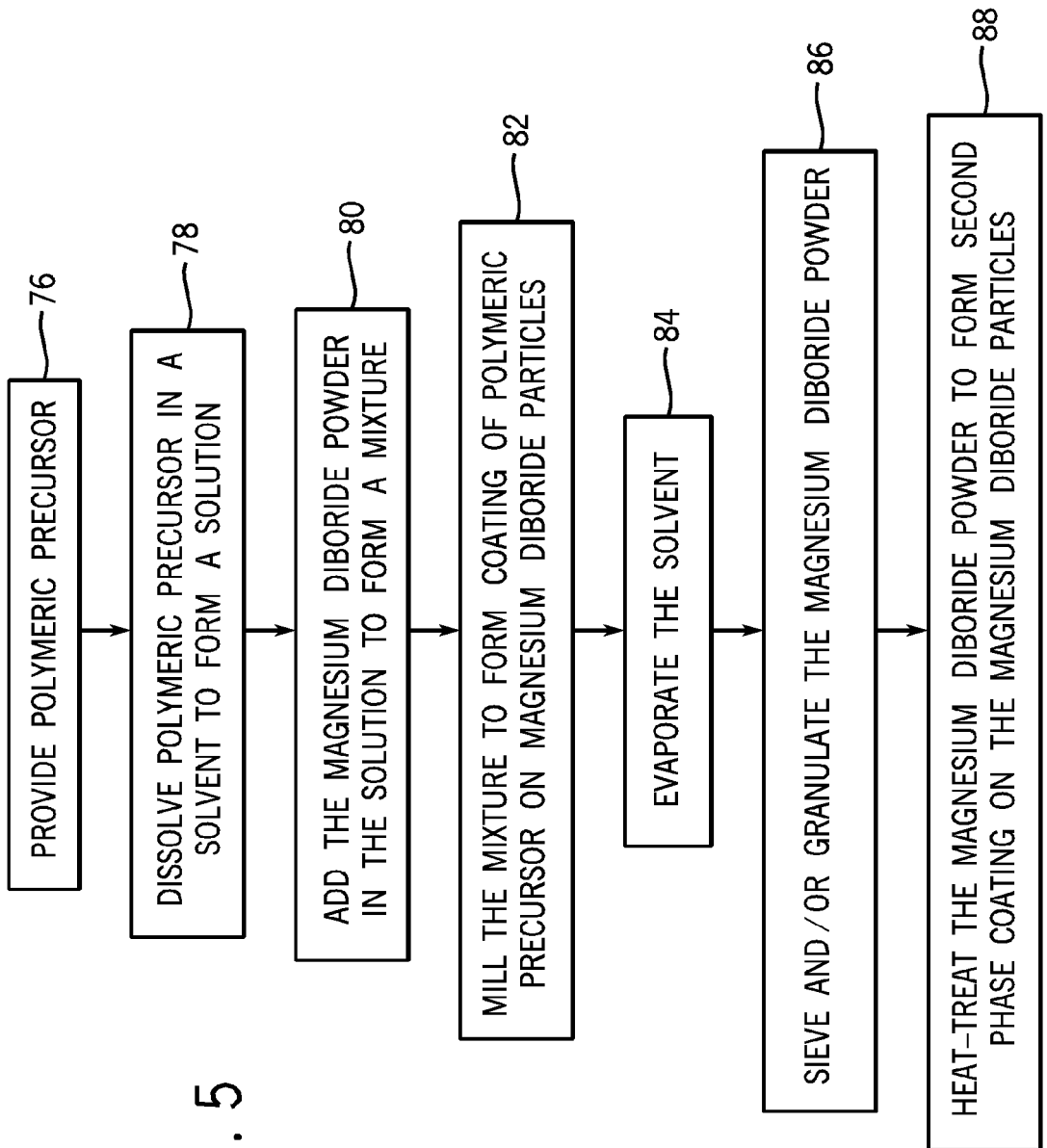

FIGS. 4 and 5 are exemplary embodiments illustrating methods of making doped magnesium diboride powders in accordance with the present techniques. In the illustrated embodiment of FIG. 4, a doped magnesium diboride powder is formed in two steps. At block 72, a first phase or a magnesium diboride powder having a plurality of magnesium diboride particles is coated with a polymeric precursor, which includes chemical elements that are configured to yield one or more second phase particles. For example, the polymeric precursor may include chemical elements that are configured to produce silicon carbide upon heat-treatment. Subsequently, at block 74, the coated magnesium diboride powder is subjected to heat-treatment to form doped magnesium diboride powder including magnesium diboride particles having the second phase particles or coatings disposed thereon. As used herein, the term "second phase coating" refers to the embodiments having second phase particles dispersed throughout the microstructure of the magnesium diboride particles, and also to the embodiments having the second phase thin film coating on the magnesium diboride particles.

FIG. 5 illustrates a more detailed method of forming a doped magnesium diboride powder, in accordance with embodiments of the present technique. At block 76, a polymeric precursor is provided, where the polymeric precursor includes chemical elements that are configured to produce one more second phases. The polymeric precursor may include, for example chemical elements, which are configured to yield silicon carbide. In one embodiment, an organometallic precursor of silicon carbide may be used. In an exemplary embodiment, a silicon carbide polymeric precursor may include polysilazane, modified siloxane, hyperbranched polycarbosilanes of the type $[R_3SiCH_2-]_x[-SiR_2CH_2-]_y-[-SiR(CH2-)_{1.5}]_z-[-Si(CH_2-)_2]$, where R may be H, $-CH_2CH=CH_2$, or a partially-allyl substituted derivative "AHPCS", nominally ['Si(allyl)0.1H0.9CH2']n, a polyacrylic nitrate (as a carbon source), a polyoxane, a cyanoxane, a carbonate, or combinations thereof.

At block 78, the polymeric precursor is dissolved in a solvent to form a solution. In embodiments where the polymeric precursor is a thermoplastic, the polymeric precursor may be pre-melted into a liquid under controlled atmosphere and the magnesium diboride powder may subsequently be blended into the liquid by using techniques such as milling, high density mixing to form a uniform coating of the polymeric precursor on the magnesium diboride particles. In some embodiments, the solvent may include one or more ketones, alcohols, THF, or combinations thereof. In one embodiment, the solvent includes ethanol.

At block 80, a magnesium diboride powder is added to the solution to form a mixture. The magnesium diboride powder may be commercially available. Subsequently, at step 82, the magnesium diboride powder and the polymeric precursor solution are mixed, by milling, high density mixing for example, to form a homogeneous mixture of the powder and the precursor and to coat the polymeric precursor solution on the magnesium diboride particles.

Additionally, the amount of doping of carbon, oxygen, nitrogen, or boron may be increased in a controlled fashion by addition of their respective sources. For example, the amount of carbon doping may be increased by adding suitable amounts of carbon sources such as carbon fibers, carbon nanoparticles to the mixture. Further, titanium, lithium, yttria, aluminum, silicon, and/or zirconium may also be added to the mixture to further enhance $J_c$. Preferably, these additives may be in the form of nanoparticles to facilitate homogeneous dispersion of these additives throughout the bulk of the magnesium diboride powder.

Subsequently, at block 84, the solvent may be removed from the solution to form a coating of the polymeric precursor on the plurality of magnesium diboride particles. In one embodiment, the solvent may be evaporated from the solution. In certain embodiments, the evaporation of the solvent may be carried out in an inert atmosphere or vacuum, thereby preventing any undesired contaminants, such as oxygen, from entering the bulk of the magnesium diboride powder. The solvent may be removed by heating the mixture at a temperature of about 15° C. to about 100° C. Further, the mixture may be heated in an inter atmosphere or vacuum.

In alternate embodiments, the magnesium diboride particles may be coated with the polymeric precursor by employing deposition techniques such as metal organic chemical vapor deposition, reactive plasma assisted chemical vapor deposition, reactive plasma assisted physical vapor deposition, chemical vapor infiltration, or combinations thereof.

At block 86, the magnesium diboride powders coated with polymeric precursor may be subjected to sieving and/or granulation to obtain a homogeneous particle size. At block 88, the magnesium diboride powder is subjected to heat-treatment to form second phase coating, such as silicon carbide coating, on the magnesium diboride particles and to diffuse dopants, such as carbon, into the lattice of the magnesium diboride. In an exemplary embodiment, during heating, the polymeric decomposition or pyrolysis of the precursor forms silicon carbide, thereby forming silicon carbide coating on the magnesium diboride particles. In certain embodiments, the heat-treating may be carried out in an oxygen-free environment to prevent any formation of non-conducting oxides in the powder which may result in decrease of $J_c$. In another embodiment, the heat-treating may be carried out in inter atmosphere or a vacuum.

Further, the heat-treatment may be carried out at a slow rate to facilitate homogeneous diffusion of dopants in the magnesium diboride lattice and homogeneous dispersion of the second phase particles in the bulk. In one embodiment, the magnesium diboride particles coated with polymeric precursor may be subjected to sintering to facilitate homogeneous dispersion of the second phase particles and homogeneous doping. In certain embodiments, the heat-treatment may be carried out at a temperature in a range of about 1400° C. to about 1900° C. In some embodiments, the heat-treatment is carried out for a period of time in a range of from about 1 hour to about 24 hours. Further, the heat-treatment may be carried out at a pressure in a range of from about $10^{-6}$ atm. to about 1 atm.

Regardless of whether magnesium diboride power is doped or undoped, the magnesium diboride powder may be drawn into various shapes such as wires, cables, or sheets. In one embodiment, the sheets may be encased in metal. In this embodiment, co-extrusion or swagging may be employed to produce these composite structures of magnesium diboride sheets encased in metal. The cables formed from the magnesium diboride powders of the present technique may be employed in imaging applications, such as MRI. As described above, these cables have high $I_c$, $J_c$ and $H_c$, thereby making these cables a desirable candidate for MRI applications. Additionally, the magnesium diboride powders of the present technique may be easily drawn into mono-filament or multi-filament cables having diameters in a range of about 1 mm to 5 mm. Also, the mechanical strength of these cables may be suited for various applications. In an exemplary embodiment, the stress experienced by the wires/cables may be in a range from about 50 MPa to about 500 MPa, and the strain experienced by the wires/cables may be in a range from about −1% to about 1%. In one embodiment, the length of the wires/cables may be in a range from about 10 cm to about $10^6$ cm.

Figure 6:
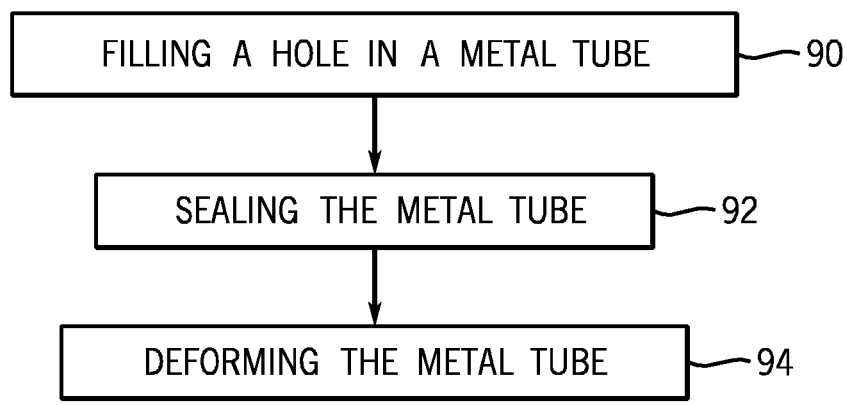
FIG. 6 is a flow chart illustrating an exemplary method of making a wire, according to certain embodiments of the present technique.

FIG. 6 is an exemplary embodiment illustrating a method of making a wire of the doped magnesium diboride powder. At block 90, a hole through a metal tube, defining a hollow metal tube, is filled with the doped or undoped magnesium diboride powder. The particles of the magnesium diboride powder are in the form of rods, pellets, powder, particles, flakes, or combinations thereof. In one embodiment, the metal tube comprises copper, copper alloys, stainless steel, tantalum, magnesium, nickel alloys, or combinations thereof. In one embodiment, the ratio of a radius of the hole to the radius of the tube is about 0.1 to about 0.99, prior to the deforming (block 94).

At block 92, the ends of the metal tube are sealed. Subsequently, at block 94, the metal tube is deformed to increase the length and to reduce the cross-sectional area. The wire may be further flattened to a tape or a film if desired. In one embodiment, the metal tube may be deformed by employing processes, such as extrusion, forging, rolling, swaging, drawing or combinations thereof. Following the deformation process, the wire, tape or film may be heat treated to improve the superconducting properties and/or the mechanical properties. In one embodiment, the wire may be heat treated at a temperature of greater than or equal to about 600° C. for a time period of greater than or equal to about 1 hour.

The wires may be advantageously formed into other similar electrically conducting structures, such as flattened tapes and wound multi-wire cables. Applications for superconducting wires are found in electromagnetic devices such as superconducting magnets, motors, transformers, and generators. Such electromagnetic devices may in turn be incorporated into larger systems, such as, for example, a magnetic resonance imaging system.

Figure 7:
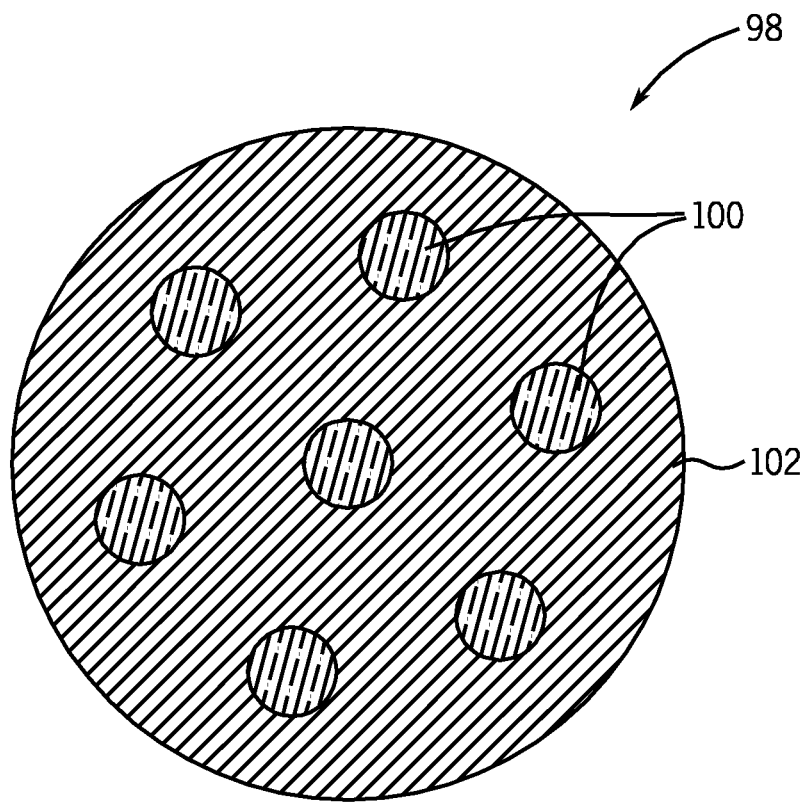
FIG. 7 is a schematic representation of a cross-sectional view of the wire made by using the method of FIG. 6.

FIG. 7 is a schematic representation of a cross-sectional view of one exemplary embodiment of the superconducting wire 98. Superconducting wire 98 includes at least one filament 100 having a doped or undoped magnesium diboride powder. The filament 100 is disposed in a metal matrix 102. For example, the metal matrix 102 may include the material of the metal tube employed to fill the magnesium diboride powders as described above with regard to FIG. 6. Although seven such filaments 100 are represented in the FIG. 7, there is no limit to the number of filaments 100 contained within superconducting wire 98, depending on the size of the superconducting wire 98, the size of each of the filaments 100 and the desired properties of the superconducting wire 98. In one exemplary embodiment, the superconducting wire 98 may have a diameter in the range of approximately 0.5 mm to approximately 1.0 mm. Further, the filaments 100 may each of a diameter in the range of approximately 0.02 mm to approximately 0.1 mm.

In accordance with another exemplary embodiment, once the superconducting wire 98 is formed, as described above, the wire may be twisted to reduce the AC loss through the wire. As will be appreciated, twisting the wire generally reduces the flux linkage through the wire which may reduce the AC loss through the wire. The number of twists formed in the superconducting wire 98 may vary depending on the desired effect. This aspect may be quantified by referring to the "pitch" of the twisted superconducting wire 98. As used herein, the "pitch" of the twisted superconducting wire 98 refers to the length of wire traversed to complete one full rotation (twist) of the wire. For example, if the superconducting wire 98 is twisted, such that the wire is rotated one full twist over a length of wire equal to 50mm, the superconducting wire 98 is said to have a "pitch" equal to 50 mm. In one exemplary embodiment, the pitch may be in the range of approximately 20 mm to approximately 200 mm. Twisting may be particularly advantageous in low frequency applications, such as those below 200 Hz, for example.

Following the manufacturing of the doped or undoped magnesium diboride superconducting wire, such as the wire 98, the wire may be coupled to similar wires to produce a continuous length of superconducting wire having a length equal to approximately the sum of the lengths of each of the superconducting wires that are coupled together. In accordance with embodiments of the present invention, the wires 98 may be coupled together by any one of a number of techniques, including, but not limited to hot welding, cold welding or diffusion bonding. Diffusion bonding is a solid phase process achieved via atomic migration with no macro-deformation of the portions of the superconducting wire to be bonded. Ideally, the connection points or joints or "joint areas" are low resistivity joints. That is, there is little or no electrical resistance through the joints which might degrade the superconducting nature of the wire 98. The connection of various segments of wire 98 will be described further below with reference to FIGS. 9-16. As used herein, a "low resistivity joint" may be a "very low resistivity joint" or a "persistent joint." As used herein, a "low resistivity joint" has a resistance through the joint area of less than or equal to $10^{-8}$ ohms/cm$^2$. As used herein, a "very low resistivity" joint has a resistance through the joint area in the range of approximately $10^{-8}$ ohms/cm$^2$ to approximately $10^{-13}$ ohms/cm$^2$. As used herein, a "persistent joint" or "superconductive joint" has a resistance through the joint area of less than or equal to $10^{-13}$ ohms/cm$^2$.

Figure 8:
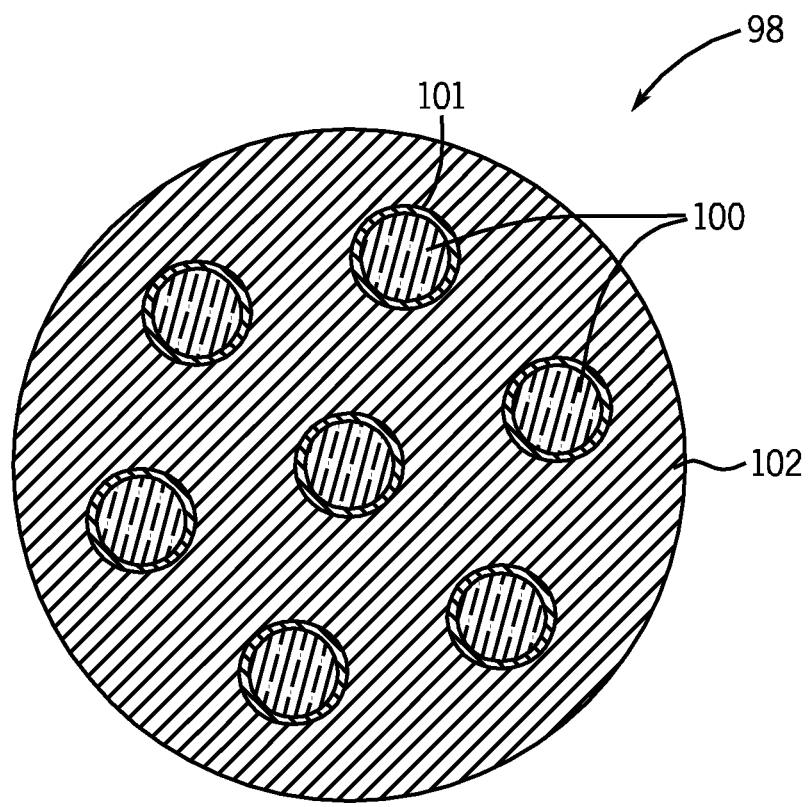
FIG. 8 is a schematic illustration of an alternate embodiment of the wire illustrated in FIG. 7.

FIG. 8 is a schematic representation of a cross-sectional view of another exemplary embodiment of the superconducting wire 98. As with the embodiment illustrated in FIG. 7, the superconducting wire 98 illustrated in FIG. 8 includes at least one filament 100 having a doped or undoped magnesium diboride powder. The filament 100 is disposed in a metal matrix 102. In some embodiments, the metal matrix 102 may be configured to act as a barrier layer. In other embodiments, an additional barrier layer, such as a barrier layer 101, may be disposed at least partially around the filament 100. In these embodiments, before the filament 100 is disposed in the metal matrix 102, in accordance with the presently illustrated embodiment, each filament 100 may be coated with a barrier layer 101. The barrier layer 101 may comprise a non-superconductive material such as stainless steel, steel, nickel, or superconductive material such as niobium, for example. Further, the barrier layer 101 may have a thickness in the range of approximately 0.001 mm to approximately 0.05 mm. Advantageously, the barrier layer 101 may be employed to increase the resistance between the individual filaments 100, thereby reducing the AC loss through the superconducting wire 98. Further, use of the barrier layer 101 may decrease the likelihood of alloy formation due to chemical reactions between the filament 100 and the metal matrix 102. In one exemplary embodiment, the metal tube in which the doped or undoped magnesium diboride powder is disposed (e.g., block 90 of FIG. 6) may be wrapped in the barrier layer 101, before introduction of the metal matrix 102 in which the filaments 100 are arranged.

As previously discussed, in order to fully utilize the super-conductive magnesium diboride wires described above, techniques for joining such wires such that they may be employed in applications requiring longer lengths of wire than may be conveniently fabricated as a single unit, such as in MRI applications, thus require the joining of two or more wires. To provide longer wires in accordance with embodiments of the present invention, and as described below with reference to FIGS. 9-16, the joining of individual wires may be achieved using thermal, mechanical and/or chemical means or combinations thereof. Many of the techniques described herein employee at least one energy source, such as, the energy provided by a beam of light, directed at those portions of the superconductive composition that are to be joined together to affect a change in the joint area. The interaction of the energy with the superconducting composition facilitates the heating of the composition, and the increase in temperature facilitate the joining of the superconductive composition. Electron beam welding, laser welding, ultrasonic welding, plasma arc welding, resistance welding, and the like, maybe employed in conjunction with the techniques described further below. Other techniques may employ purely mechanical process such as deformation of the wire ends, pressing, swaging, rolling, drawing, extruding or isopressing, for example, as described further below.

Figure 9:
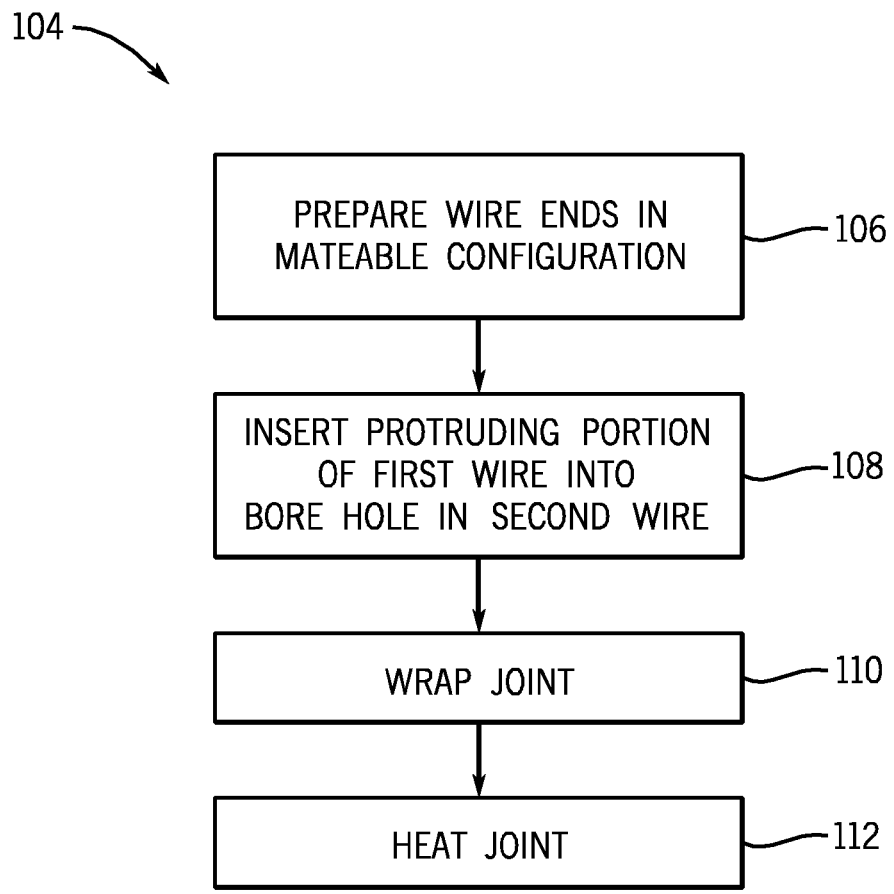
FIG. 9 is a flow chart illustrating a method of making a wire, according to certain embodiments of the present technique.
Figure 10:
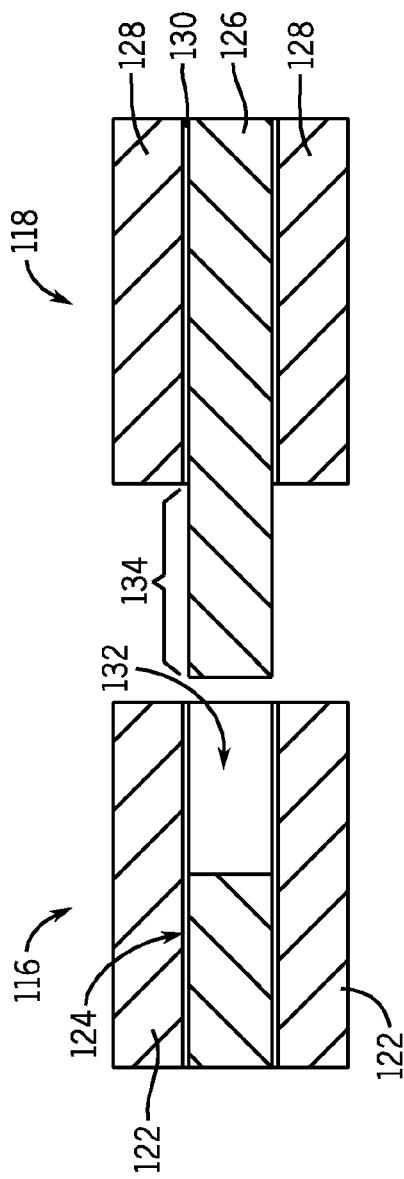
FIGS. 10-11 are diagrammatical views of wires fabricated in accordance with the method of FIG. 9.
Figure 11:
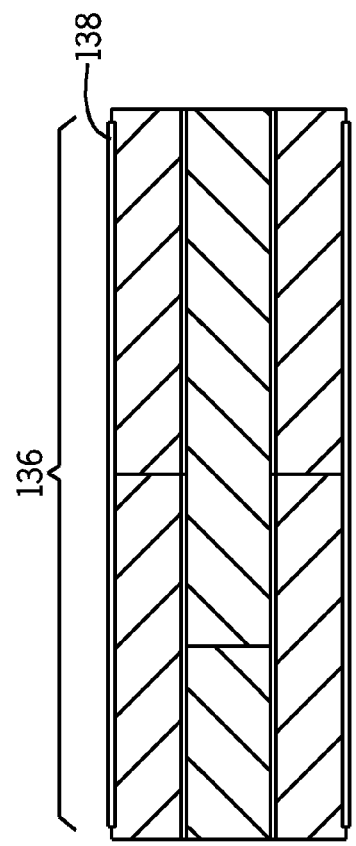

Referring now to FIGS. 9-11 one technique for joining magnesium diboride wires (doped or undoped) is described and illustrated. More specifically, FIG. 9 is a flow chart of a method, generally designated by the reference numeral 104, of joining two magnesium diboride wires together, and FIGS. 10 and 11 illustrate the diagrammatical views of portions of the process 104. Thus, FIGS. 10 and 11 will be described with reference to the process 104 of FIG. 9. As will be appreciated, the techniques described herein may be employed to join doped magnesium diboride wires, as described with reference to FIGS. 2-8, or undoped magnesium diboride wires, to form longer wires. Further, while the figures and accompanying text describe the present techniques for joining the wires as methods for joining two superconductive wires having magnesium diboride filaments, the present method could also be used to join one wire having magnesium diboride filaments to another wire, wherein the filaments of the second wire are superconductive, but not magnesium diboride, or the filaments are non-superconductive.

In accordance with the method 104, the ends of the two wires to be joined are prepared in a mateable configuration, as indicated in block 106. Referring briefly to FIG. 10, a first wire 116 and a second wire 118, each having magnesium diboride filaments (doped or undoped) are illustrated after preparation of the ends in a mateable configuration (block 106 of FIG. 9). Specifically, the wire 116 includes magnesium diboride filaments 120 surrounded by a metal cladding or tube 122. The metal cladding 122 may comprise copper or stainless steel, for example. Further, the wire 116 may include a diffusion barrier 124. Similarly, the wire 118 includes magnesium diboride filaments 126 surrounded by a metal cladding or tube 128 and having a diffusion barrier 130. In order to prepare the wires 116 in a mateable configuration, a portion of the magnesium diboride filaments 120 is removed to provide a borehole 132. To create the borehole 132, wherein a portion of the magnesium diboride filaments is removed, the magnesium diboride filaments 120 can be mechanically bored using a pick, for instance, or may be chemically bored, using a suitable chemical that will dissolve the magnesium diboride material, without dissolving the diffusion barrier 124 or the metal tube 122. For instance, chemicals such as nitric acid ($HNO_3$) may be used to create the borehole 132 in the first wire 116.

The wire 118 is mateably prepared by removing a portion of the metal cladding 128 and diffusion barrier 130 to expose an extended portion 134 of the magnesium diboride filaments 126. The metal cladding 128 and the diffusion barrier 130 may be stripped using mechanical or chemical means. The length of the extended portion 134 of magnesium diboride filaments is configured to be approximately the same length as the depth of the borehole 132 in the wire 116. As used herein, this configuration is referred to wherein as a "mateable configuration," wherein the extended portion 134 of the wire 118 is sized such that it is configured to mate with the borehole 132 of the wire 116.

Referring again to FIG. 9, after preparation of the ends of the wires in the mateable configuration (block 106), the end of the wire having the extended portion (e. g., wire 118 of FIG. 10) is inserted into the wire having the borehole (e.g., wire 116 of FIG. 10), as indicated in block 108. Once the ends of the wires are mateably inserted, the joint area may be wrapped or sleeved with another material that may provide mechanical strength to the joint area, as well as a diffusion barrier and/or electrical quench medium, such as copper or steel, as indicated in block 110. After the joint area is wrapped the joint may be subjected to localized heating to assist in forming a region of superconductivity, as indicated in block 112.

FIG. 11 illustrates the joint area 136 after the mateable coupling of the wires 116 and 118 (FIG. 10) employing the process 104 of FIG. 9. As illustrated in FIG. 11, the wires 116 and 118 have been mateably coupled and the joint 136 has been surrounded by a material 138, which may provide additional mechanical strength, a diffusion barrier, and/or an electrical quench medium. For instance, the material 138 may comprise copper or steel, as described above.

Figure 12:
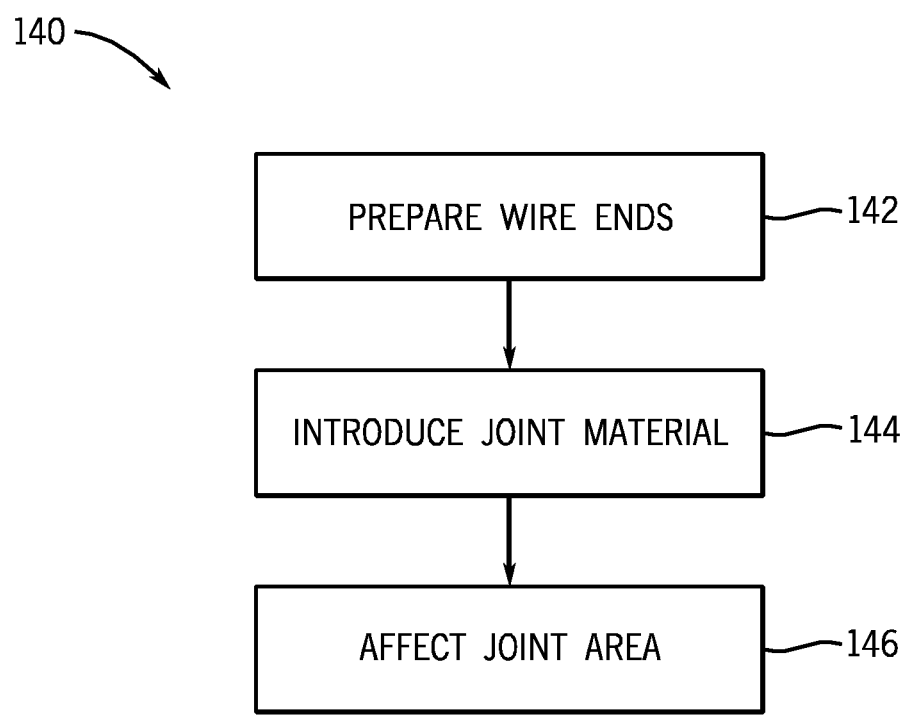
FIG. 12 is a flow chart illustrating another method of making a wire, according to certain embodiments of the present technique.

Referring now to FIGS. 12-16, additional embodiments for joining superconductive wires in accordance with embodiments of the invention are described. Specifically, FIG. 12 is a flow chart illustrating a method 140 for joining two superconducting magnesium diboride wires (doped or undoped) in accordance with embodiments of the present techniques. FIGS. 13-16 illustrate diagrammatical views to aid in the understanding of the various embodiments of the method 140. In general, the joining techniques described with reference to FIGS. 12-16 employee steps of introducing a magnesium diboride joint material to the ends of the wires and affecting the joint area such that the ends of the wires are electrically and mechanically coupled together. Generally, affecting the joint area may be accomplished by a chemical process, a mechanical process, a thermal process, or combinations thereof. For example, in one embodiment, the process may include deforming the ends of the wires to densify the joint area and heating the joint area in order to sinter the material in the joint area. In addition to the magnesium diboride joint material, a number of other materials may be introduced to the joint area to aid in the electrical performance and superconductivity of the joint area to provide a persistent bond. The diagrammatical views illustrated in FIGS. 13-16 will provide further detail in describing the various embodiments of the method 140. Initially, however, the steps of the method 140 will be generally described.

Referring now to FIG. 12, the first step in the method 140 is to clean and prepare the ends of the wires to be joined, as indicated in block 142. Next, a joint material may be introduced to the joint area, as indicated in block 144. The introduction of the joint material will be described and illustrated further below with reference to FIGS. 13-16. After introduction of the joint material, the ends of the wires (i.e., the joint area) may be affected so as to cause the ends of the wires and the joint material to be electrically and mechanically coupled together, as indicated in block 146.

The joint area may be affected by employing a chemical process, a mechanical process, a thermal process, or combinations thereof. By affecting the joint area, the magnesium diboride filaments of the two wires and the magnesium diboride joint material will be electrically and mechanically coupled together. Exemplary chemical processes that may be employed include, but are not limited, evaporation of a slurry component, curing of a slurry component, volatilization of a slurry component, or reaction-based processes, such as sublimation or exothermic reactions. Exemplary mechanical processes that may be employed include, but are not limited to deformation, pressing, swaging, rolling, drawing, extruding, or iso-pressing. Exemplary thermal processes that may be employed include, but are not limited to solid-state sintering, liquid-phase sintering, annealing, or diffusion bonding, as applied through heating by radiation, convection, induction, resistance, rricting, electrical arcing, laser treatment, or electron beam treatment. Combinations of mechanical, thermal and chemical processes may also be employed (e.g., hot pressing, reactive laser sintering, etc.).

Figure 13:
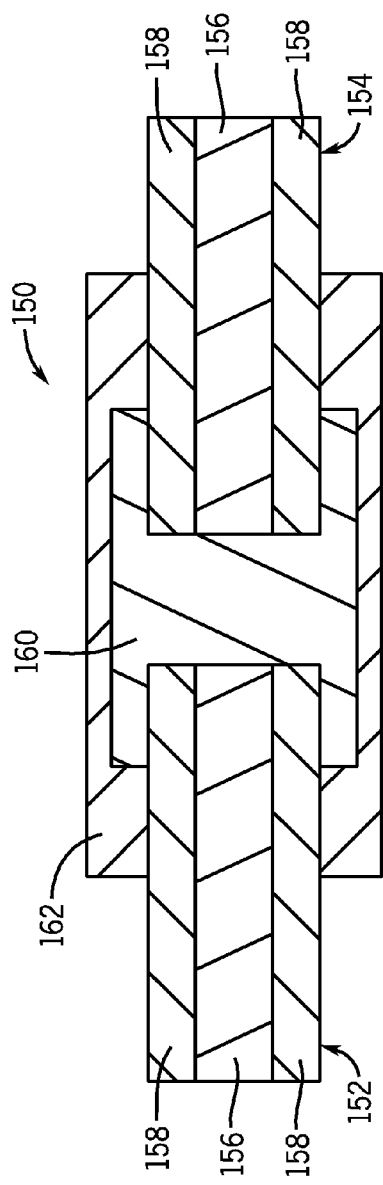
FIGS. 13-16 are diagrammatical views of wires fabricated in accordance with the method of FIG. 12.

FIG. 13 is a diagrammatical view illustrating one embodiment of a joint 150 fabricated in accordance with the method 140 of FIG. 12. In the embodiment illustrated in FIG. 13, the joint 150 is a butt joint. While a butt joint is illustrated in FIG. 13, it will be appreciated that the joint 150 may comprise a number of other geometries. For instance, the geometry of the joint 150 may comprise a scarf joint, lap joint, bridle/box joint, telescoping joint, or a bridge joint, for example. As illustrated, the end of the first wire 152 is coupled to the end of the second wire 154. Each of the wires 152 and 154 include magnesium diboride filaments 156 (doped or undoped) surrounded by a conductive cladding 158. Though not illustrated, the wires 152 and 154 may include other layers such as a diffusion barrier layer, as previous described. In accordance with the method 140, in the embodiment illustrated in FIG. 13, the ends of the wires 152 and 154 are initially prepared, as indicated in block 142 of FIG. 12. The ends of the wires 152 and 154 are cut or squared to expose the magnesium diboride filaments 156 of each wire 152 and 154. The ends of the wires 152 and 154 are cleaned to remove any debris caused by squaring the ends and the wires 152 and 154 are placed in close proximity to one another.

Next, a joint material 160 may be introduced (block 144 of FIG. 12). The joint material 160 may include magnesium diboride (doped or undoped) in a liquid or powder form. Alternatively, the joining material 160 may include a magnesium diboride composite that includes magnesium diboride combined with another material. For instance, the magnesium diboride material may be combined with conventional low- and/or high-temperature superconductors such as $Nb_3Sn$, NbTi, YBCO and related compounds, and any compositions related to the following families of superconducting materials: BiStCaCuO, TlBaCaCuO, or HgBaCaCuO, for example. These additional materials may be high temperature superconducting (HTS) materials other than magnesium diboride or they may be non-superconducting materials. The materials may act as a joining/flux agent which retains superconducting properties after being joined to the ends of the magnesium diboride wire based on their superconducting transition temperatures which exceed that of the magnesium diboride filaments 156 of the wires 152 and 154. In another exemplary embodiment, the joining material 160 may include a magnesium diboride powder mixed with a cuprate having a high transition temperature, such as YBa2Cu3O(7-d). Still further, the joint material 160 may include a cuprate plus a precipitate, such as magnesium oxide, carbide, boride or oxide. In another embodiment, the joint material 160 may include a composite of magnesium diboride (doped or undoped) and a resistive material, such as solder. Still further, the joint material 160 may include a composite of magnesium diboride, along with a magnesium diboride powder, or a composite of doped magnesium diboride, combined with undoped magnesium diboride.

Once the joint material 160 is introduced to the ends of the wires, the joint area may be wrapped in another material which will later act as a diffusion barrier or electrical quench medium, such as copper or steel. The wrapping material 162 may also provide mechanical strength to the joint 150. After deposition of the joint material 160 and the wrapping material 162, the ends of the wires 152 and 154 may be affected to electrically and mechanically join the magnesium diboride filaments 156 through the joint material 160, as indicated in block 146 of FIG. 12. In one embodiment, the ends of the wires 152 and 154 may be deformed to densify the joint area and the magnesium diboride filaments 156 along with joint material 160 to form a mechanical bond. The deformation may be performed by cold swagging, magnetic pulse deformation or any other means which serves to densify the joint material 160. The ends of the wires 152 and 154 and the densified joint material 160 may then receive localized heating to sinter the joint 150 thereby forming a region which is persistently superconducting, for example.

Figure 14:
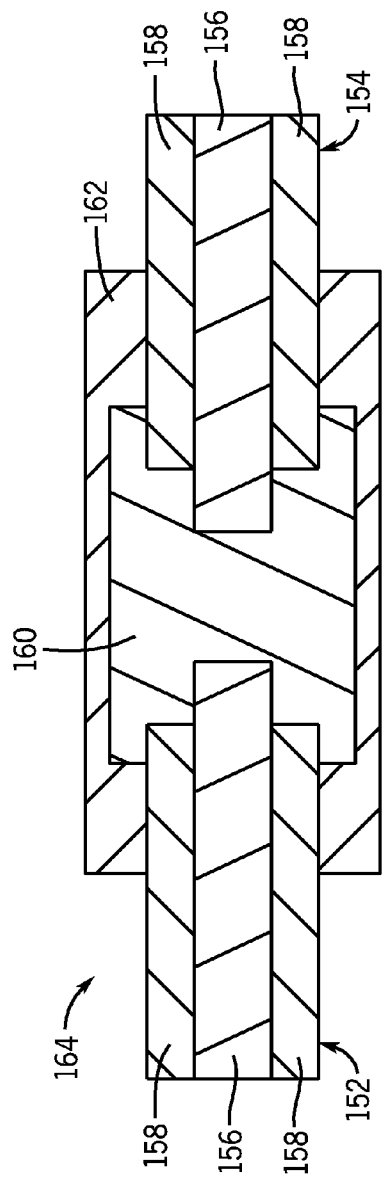

Turning now to FIG. 14, an alternate embodiment of a butt joint 164 is illustrated. In the embodiment illustrated in FIG. 14, during the preparation step (block 142 of FIG. 12) the cladding material 158 is stripped from the ends of each wire 152 and 154 thereby leaving an extended portion of magnesium diboride filaments 156, protruding from the cladding material 158. Advantageously, by exposing protruding portions of the magnesium diboride filaments 156, the electrical coupling between the filaments 156 and the joint material 160 maybe improved. Further, in accordance with this embodiment, the material 160 may comprise a solid joint material, such as, magnesium diboride, boron or an HTS material having bores formed on ether side such that the solid joint material 160 is configured to mateably receive the protruding ends of the exposed magnesium diboride filaments 156 of each wire 152 and 154.

Figure 15:
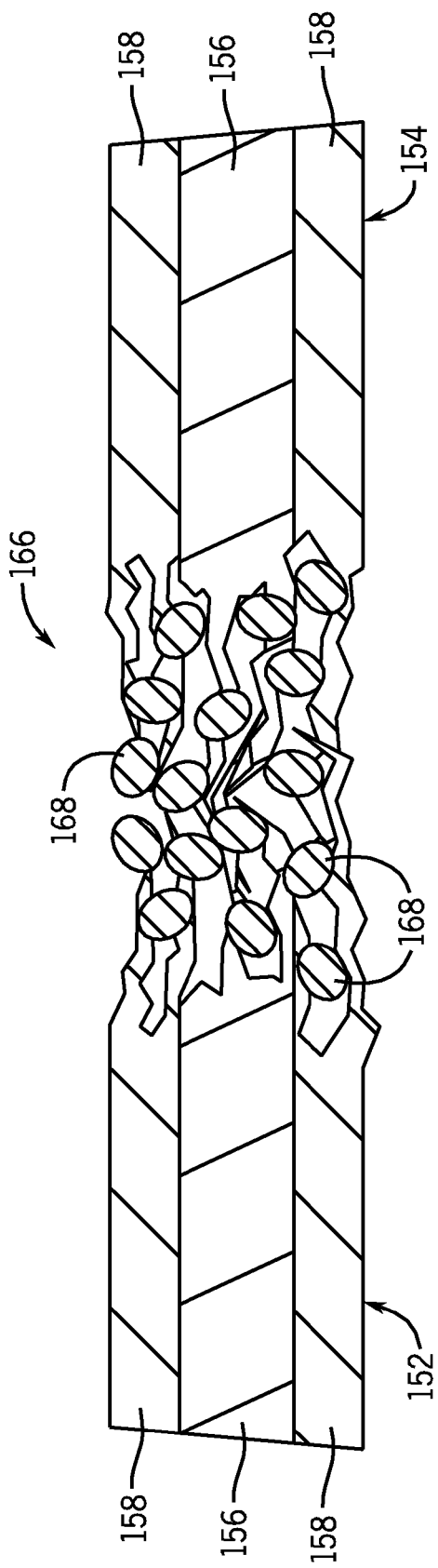

Turning now to FIG. 15, another embodiment of a joint 166 fabricated in accordance with the method 140 of FIG. 12 is illustrated. In the embodiment illustrated in FIG. 15, during the preparation step (block 142) the ends of the wires 152 and 154 are prepared by shredding the ends to provide roughened ends of the magnesium diboride filaments of each wire 152 and 154, as well as roughened ends of the cladding material 158 which will aid in the formation of the joint area. The ends may be shredded using nitric acid, for example, to create a brush-like or broom-like end of each wire 152 and 154. The shredded ends may provide mechanical stability and higher surface area contact. Here, a magnesium diboride/solder composite 168 is introduced as the joint material. During joint affectation (block 146) the magnesium diboride/solder composite 168 is mechanically forced into contact with cladding 158 and the magnesium diboride filaments 156 of wires 152 and 154. The joint area 166 may be further sintered during a heating process.

Figure 16:
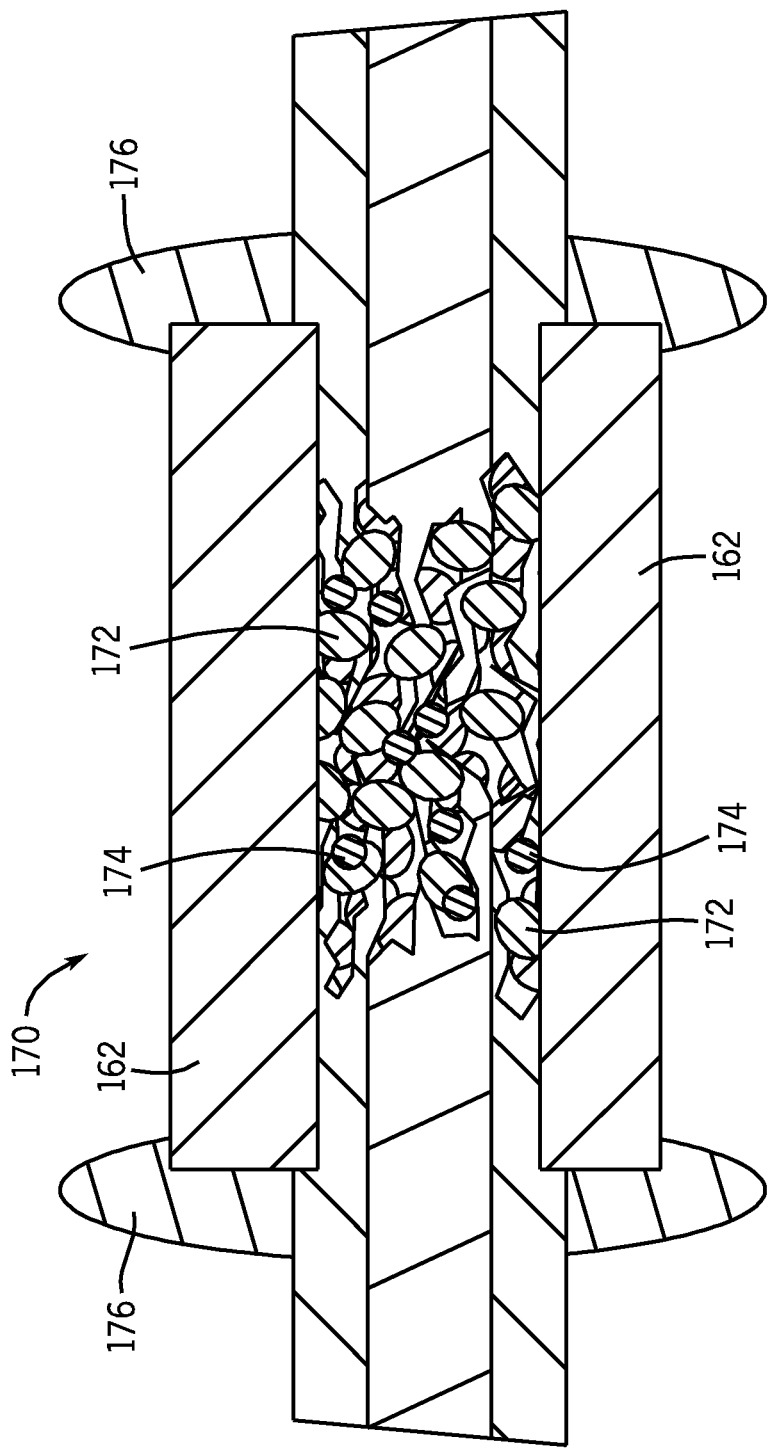

FIG. 16 illustrates a diagrammatical view of yet another joint 170 that may be fabricated in accordance with the method 140 of FIG. 12. As illustrated in FIG. 16, the joint 170 comprises the cuprate material 172 having a higher critical temperature than the magnesium diboride filaments 156. Further, the joint 170 includes the precipitate 174, such as magnesium oxide, carbide, boride or another oxide, for example. The joint material (here, the cuprate 172 and precipitate 174) are surrounded by a cladding material 162. Further, the embodiment of FIG. 16 further includes heat sinks 176 located around the ends of the joint region 170 to improve the persistence of the joint 170. The heat sink 176 may comprise silver or solder, for example.

In yet another embodiment, the overlapping section comprising the exposed ends of the superconducting filaments along with a filler material comprising a doped magnesium diboride powder, a magnesium diboride powder, or a combination of magnesium powder and boron powder are resistively heated. The heating promotes a chemical reaction between the magnesium and the boron to produce magnesium diboride. The magnesium diboride may be used to facilitate the joining of the superconducting wire.

In one embodiment, the joining generally occurs at a temperature of about 650° C. to about 1000° C. It is generally desirable to perform the joining in a manner so as to obtain a "bridge superconducting cross section" between the first end of the first superconducting wire and the second end of the second superconducting wire. When the bridge superconducting cross section is less than the superconducting cross section on the filament or the tape, the bridge superconducting cross section limits the current carrying capacity in the connected superconducting elements. Therefore, the bridge superconducting cross section is, preferably, at least as large as the superconducting cross section on the filament or the tapes.

The current carrying capacity of a formed joint can be tested by soldering voltage probes to the superconducting filament tape on both sides of the weld. The joint is cooled below the critical temperature of the superconductor and increasing amounts of current are passed through the weld while the voltage change between the probes is monitored. The current at which a sufficient voltage change is detected, e.g., about 0.02 micro volts, is the critical current. If the current carrying capacity in the weld is less than the current carrying capacity in the filament and/or tape, the number of bridges or size of the bridges can be increased in the joint to form a larger bridge superconducting cross section.

As stated above, these methods of joining may be effectively used to create extended sections of the superconducting wire that may be advantageously used in electrically conducting structures, including, but not limited to, flattened tapes, laminated wires formed from multiple wires, and wound multi-wire cables. Applications for superconducting wires are found in electromagnetic devices such as, but not limited to, superconducting magnets for motors, transformers, and generators. Such electromagnetic devices may in turn be incorporated into larger systems, such as, for example, a magnetic resonance imaging system.

Although the magnesium diboride powders of the present technique are described with respect to MRI applications, as will be appreciated, the magnesium diboride powders as disclosed above may be employed in several other techniques, such as power generation, generators, motors, fault current limiters, or any other superconducting applications.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method of joining wires, the method comprising:
   introducing a magnesium diboride joint material to an end of a first wire and an end of a second wire at a joint area, wherein at least one of the first and second wires comprises superconductive magnesium diboride filaments, and wherein the magnesium diboride joint material comprises a solid joint material having bore holes formed therein;
   stripping the ends of each of the first and second wires to expose an extended portion of the superconductive magnesium diboride filaments of each of the first and second wires;
   inserting the extended portion of the superconductive magnesium diboride filaments of each of the first and second wires into the bore holes; and
   affecting the joint area such that the end of the first wire and the end of the second wire are electrically and mechanically coupled through the magnesium diboride joint material.

2. The method, as set forth in claim 1, wherein each of the first and second wires comprises the superconductive magnesium diboride filaments.

3. The method, as set forth in claim 1, wherein affecting the joint area comprises heating the joint area to sinter the superconductive magnesium diboride filaments of each of the first and second wires and the magnesium diboride joint material.

4. The method, as set forth in claim 1, comprising:
   preparing the end of the first wire; and
   preparing the end of the second wire, before introducing the magnesium diboride joint material.

5. The method, as set forth in claim 1, wherein stripping the ends of the first and second wires comprises stripping a cladding material to expose the extended portion of the superconductive magnesium diboride filaments of each of the first and second wires.

6. The method, as set forth in claim 1, wherein the magnesium diboride joint material is doped.

7. The method, as set forth in claim 1, wherein introducing a magnesium diboride joint material comprises disposing a composite material comprising magnesium diboride and at least one other material on the joint area.

8. The method, as set forth in claim 7, wherein the at least one other material comprises a superconductor.

* * * * *